United States Patent [19]

Sella et al.

[11] Patent Number: 4,511,451

[45] Date of Patent: Apr. 16, 1985

[54] DEVICES FOR PREPARING SUBSTRATES COATED WITH A THIN LAYER OF PLATINUM OXIDE AND SUBSTRATES SO COATED

[75] Inventors: Claude Sella, Meudon La Foret; Vien Tran-Khanh, Gagny; Jean-Claude Martin, Meudon, all of France

[73] Assignee: Centre National de la Recherche Scientifique, Paris, France

[21] Appl. No.: 530,676

[22] Filed: Sep. 9, 1983

[30] Foreign Application Priority Data

Sep. 10, 1982 [FR] France .............................. 82 15378

[51] Int. Cl.³ ............................................. C23C 15/00
[52] U.S. Cl. ................................. 204/298; 204/192 R; 204/192 C; 204/192 SP; 428/432; 428/469; 428/615; 428/629; 428/669; 428/670
[58] Field of Search ............................ 204/298, 192 R

[56] References Cited

U.S. PATENT DOCUMENTS 4,440,108  4/1984  Little et al. ........................ 204/298

FOREIGN PATENT DOCUMENTS 759020  4/1971  Belgium .............................. 204/298

Primary Examiner—Arthur P. Demers
Attorney, Agent, or Firm—Cushman, Darby & Cushman

[57] ABSTRACT

To coat a substrate with a thin layer of pure platinum oxide, an insulating and transparent substance, recourse is had to a cylindrical magnetron comprising means for generating an axial magnetic field in an enclosure containing rarefied oxygen, an axial cathode at least coated with platinum and a cylindrical grid forming an anode and coaxially surrounding the cathode so as to reserve an annular zone outside the grid. The substrate is placed in the said zone so that its surface to be coated by the thin layer is shielded from the impact of electrons. This shielding can be obtained by a particular shape given to the bars constituting the grid or by the positioning of obstacles in the said zone. It then suffices to heat the thin layer, whether or not locally, to above 250° C., to convert it into conducting and opaque platinum.

6 Claims, 3 Drawing Figures

DEVICES FOR PREPARING SUBSTRATES COATED WITH A THIN LAYER OF PLATINUM OXIDE AND SUBSTRATES SO COATED

BACKGROUND OF THE INVENTION

The invention relates to the technique of thin layers of platinum oxide deposited on substrates by cathodic spraying or sputtering of a target of platinum in a rarefied oxygen atmosphere.

Such thin layers have great interest in view, on the one hand, of their insulating nature to electricity and their relative transparency and, on the other hand, the very great ease of their transformation, localised or not, into platinum, a metal conducting electricity and opaque to light, such a transformation being obtainable by simple heating to a temperature above 250° C.

In presently known methods of realisation, it has not been possible to produce such thin layers sufficiently pure to be able to draw benefit from the possibility indicated above.

In fact, the electrons which are at the origin of cathodic spraying and which, for this purpose, form a plasma through their impact against the atoms of gas constituting the rarefied atmosphere, are not all consumed by this formation and the platinum oxide molecules developed from platinum atoms extracted from the target by the ions of this plasma are decomposed by the residual electron flow, either in flight, before arriving at the substrate, or after their arrival at this substrate.

GENERAL DESCRIPTION OF THE INVENTION

It is a particular object of the invention to overcome this drawback, by eliminating the troublesome influence which has just been indicated of the residual electron flux, whilst preserving an electron flux of sufficient density in the vicinity of the cathode to ensure the formation of an intense plasma in this zone as well as effective cathodic spraying and by maintaining sufficient accessibility between the cathode and the substrate for the platinum oxide molecules.

To this end, according to the invention: recourse is had to a magnetron comprising itself on the one hand means for generating a magnetic field and on the other hand, within an enclosure containing rarefied oxygen, a cathode extending parallel to the magnetic field, which cathode is at least coated by a layer of platinum, and a grid forming an anode extending parallel to the cathode, facing its platinum layer, so as to reserve within the enclosure a chamber situated on the side, of the grid, opposite that where the cathode is located, and placing the substrate in said chamber so that its surface to be coated by the thin layer of platinum oxide is shielded from the impact of the electrons, which, coming from the cathode, are led to circulate in this chamber after having traversed the grid.

In preferred embodiments, recourse is had also to one and/or other of the following features:

the magnetron is cylindrical in the sense that the magnetic field extends along an axis, that the cathode extends along this axis, that the anode grid is cylindrical and surrounds the cathode, coaxially with the latter, and that the chamber in which the substrate is placed is annular external to the grid, the shielding of the surface of the substrate to be coated is ensured by exposing this surface towards the downstream direction of the trajectories of the electrons concerned, the shielding of the surface of the substrate to be coated is ensured by placing in the chamber obstacles opaque to the electrons concerned, the obstacles according to the preceding paragraph are flat bars of which the middle plane is perpendicular or almost so to the trajectories of the electrons concerned, the shielding of the surface of the substrate to be coated is ensured by constituting the grid by means of flat bars of which the middle plane is perpendicular or almost perpendicular to the trajectories of the electrons concerned.

The invention relates also to substrates coated with a thin layer of pure platinum oxide, and in particular those for which the deposit of this thin layer is formed by means of a device such as defined above.

It relates finally to products obtained from such substrates coated with a thin layer of pure platinum oxide, and in particular:

the coated substrates with printed circuits obtained by localised heating of said layer at more than 250° C., substrates coated with a thin layer of amorphous platinum obtained by heating the thin layer of platinum oxide at a temperature comprised between 250° and 500° C., and substrates coated with a layer of pure crystalline platinum obtained by heating the thin platinum oxide layer to a temperature comprised between 800° and 1,100° C.

The invention comprises, apart from these main features, certain other features which are preferably used at the same and which will be more explicitly considered below.

In the following, preferred embodiments of the invention will be described with reference to the accompanying drawing given of course purely by way of non-limiting example.

DESCRIPTION OF PREFERED EMBODIMENTS

The production device concerned is essentially constituted by a cylindrical magnetron comprising:

a cylindrical vacuum enclosure 1 with axis X, connected to pumping means (not shown), adapted to create the vacuum in this enclosure, a cathode 2 constituted by a rod extending along the axis X inside the enclosure 1, an anode 3 constituted by a cylindrical grid surrounding the cathode 2, coaxially with the latter and arranged like the latter within the enclosure 1 dividing it into a central zone A inside the grid and an annular zone B outside, and at least one electrical winding of revolution 4 adapted to generate a magnetic field H orientated along the axis X.

Figure 1:
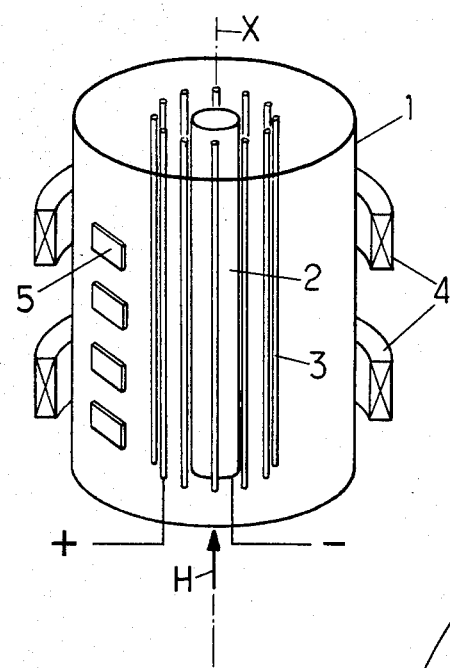
FIG. 1 shows, in perspective view, an embodiment of a device constructed according to the invention to produce thin layers of pure platinum oxide.
Figure 2:
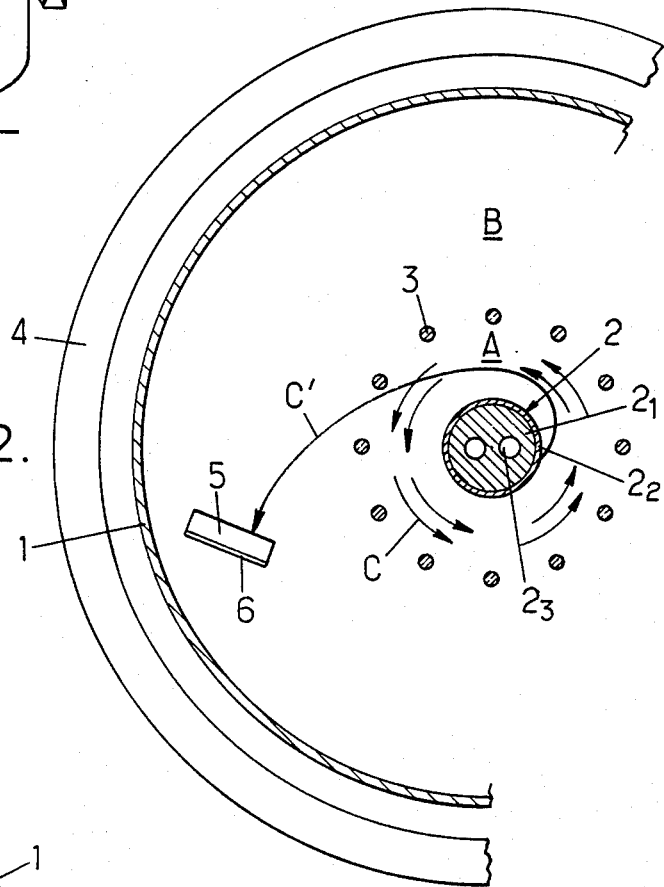
FIG. 2 shows diagramatically a part of the same device along an enlarged cross-section.

It is in the annular zone B that are placed, according to the invention, the substrates 5 to be coated with a thin layer 6 (FIG. 2) of platinum oxide taking care to place the surface, of each of the substrates, intended to be coated with the thin layer, sheltered from the electrons, as will be specified further below.

Enclosure 1 contains a rarefied gas based on oxygen, which gas is advantageously pure oxygen or a rare gas (argon, krypton, xenon . . . ) mixed with the oxygen.

The cathode 2, designed to function as a target, may be constituted by a platinum bar but it is preferably constituted by a bar $2_1$ of another electrically conducting material, coated with a layer or foil of platinum $2_2$ and cooled internally by a flow of water through channels $2_3$.

The anode grid 3 is constituted by a ring of parallel bars. In such an apparatus, the trajectories of the electrons which are discharged by the cathode 2 in the direction of the anode 3 are incurved by the axial magnetic field and describe, all in the same direction, orbits C of cycloidal shape around the cathode.

The flow of these electrons in the central zone A, inside the grid, is sufficiently intense to form in this zone a plasma by impact between the electrons and the atoms of the rarefied gas.

The constituent positive ions of this plasma bombard the cathode target 2 and extract platinum atoms from it, which are projected radially outwards and combine with the surrounding oxygen, forming molecules of platinum oxide.

It is those, of these molecules, which arrive at traversing the plasma and the anodic grid, which form the desired deposit in a thin layer on the substrate 5.

However the orientation of the surface of this substrate on which the deposit concerned is effected, is not immaterial.

In fact, if the electrons which have been able to escape from the central zone A through the bars of the grid 3, to penetrate into the annular zone B, are much less numerous than those flowing in this central zone, they exist nonetheless: they describe again in the zone B trajectories C of cycloidal shape, all orientated in the same direction around the axis X.

Due to the fact of the directivity of this residual flow of electrons, its influence on the deposit depends on the orientation of the face concerned of the substrate.

Applicants have discovered that on that one, of these faces, which is not exposed to the impact of residual electrons, the platinum oxide deposit is effected in the form of pure thin layer 6, stable and strongly adhered to said surface: this layer, colored a brown-yellow, is transparent to visible light and highly electrically insulating, its resistivity being comprised between 100 and 1.000 ohm.cm.

On the contrary, on all the other surfaces of the substrate, the deposits effected are constituted finally:

either by mixtures of platinum and platinum oxide having the typical black appearance of a cermet, or by pure platinum of metallic appearance.

If in fact the oxide molecules undissociated "in flight" by an electron impact arrive indifferently on all the surfaces of the substrate, only those which have reached the surface, of the substrate, "hidden" from the residual electrons, preserve their integrity.

In summary, the annular zone B is sufficiently "calm" as regards the flow of electrons, for the bombardment by these electrons of the thin layer being formed, to be suppressed merely by the judicious choice adapted for the orientation for the surface concerned of the substrate, the latter "turning its back" to the residual electrons which flow in said annular zone B.

It is possible to obtain the same effect by reducing the size of this residual flux without however reducing the flow rate of the radial projections of oxide molecules.

Figure 3:
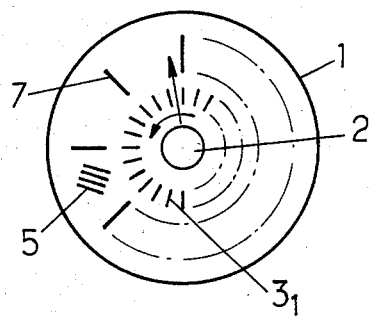
FIG. 3 shows also diagramatically a modification of this device along a cross-section.

For this purpose, for example, the bars of the anode are given the form of platelets or fins $3_1$ (FIG. 3) extending radially or in directions slightly inclined to the radial directions passing through their centres: such a construction results in fact in a trapping of the electrons flowing along cycloidal trajectories although they remain entirely transparent to the radial projections.

The same effect can be obtained or reinforced by arranging in the annular zone B, radial or substantially radial masks 7, opaque to the electrons, these masks being advantageously brought to the same potential as the anode 3.

All the usual main steps concerning cathodic sputtering can also be adapted within the scope of the present invention if they are both advantageous and compatible with the latter.

Thus it will be possible to make the deposits uniform by mounting the substrates on rotary supports and/or by moving the constituent bars of the anode 3 around the cathode.

There are given below, purely by way of illustration, some specifications on embodiments of the invention which have given full satisfaction:

the pressure of the rarefied oxygen mixture was of the order of $10^{-2}$ millibar, the cathode 2 was taken to a potential of 3,000 V, whilst the anode 3 was grounded, the axial magnetic field was comprised between 50 and 100 G, the target was constituted by a platinum jacket of 1 mm thickness attached to a cylindrical copper core having a diameter of 5 cm and a length of 22 cm, the grid 3 was constituted by ten stainless steel bars forming a cylindrical cage of 15 cm diameter, the substrates 5, constituted of a conducting material such as copper or on the contrary of insulating material such as glass, were placed at distances from the target 2 comprised between 10 and 15 cm and were aligned parallel to each other along columns parallel to the axis X, the thin layers 6 of platinum oxide obtained had a thickness of the order of 0.1 to 0.2 $\mu$m.

As a result of which, with the above-described device substrates coated with particularly pure thin layers of platinum oxide were obtained.

As indicated above, such layers have the following great advatage: the oxide concerned $PtO_2$ is both optically transparent and highly electrically insulating and, to convert it irreversibly into platinum, a substance opaque to light and electrically conducting, it suffices to heat this oxide to a temperature above 250° C.

This irreversible transformation is found to be particularly interesting if it is localised accurately by heating the thin layer in a predetermined pattern.

Such localised heating can be effected by means of a laser beam, or an electron or ion beam, or again by an almost instantaneous projection onto the thin layer of a heat image formed by lighting a flash lamp separated from this layer by a mask locally transparent to the light, or by a heat contact ensured by the brief application to the thin layer of a heated plate, locally perforated, which can in the limit be reduced to a simple wire.

The resulting products, which comprise areas constituted alternately of platinum and platinum oxide in a particular pattern, remain stable up to a temperature of 200° C.

They lend themselves to numerous uses, for example the constitution of conducting or resistant printed circuits, or again to that of permanent optical memories (video-disks).

In addition, if the heating temperature, which is higher than 250° C., remains below 500° C., the platinum resulting from the partial reduction of the oxide is in its amorphous state which phase precipites in the subsisting matrix of said oxide in the form of ultrafine particles having a diameter of the order of 20 Å: this amorphous platinum has certain advantageous characteristics, in particular in the field of catalysis or in that of energy absorption exploiting the black body effect (photo-thermal sensors).

Finally, if the temperature of the heating exceeds 500° C., the amorphous platinum crystallises, still in the form of ultrafine grains: towards 800° C., the decomposition of the oxide is complete, the platinum grains coalesce and complete crystallisation is observed. After heating to about 1,000° C. followed by slow cooling, the electrical and optical properties of pure solid platinum are recovered. There is therefore provided here a method enabling the coating of a substrate with a very thin layer of pure platinum, which can result in numerous interesting applications, such as, for example, the manufacture of heat probes.

As a result of which, and whatever the embodiment adopted, there is provided finally a formula enabling the obtaining of pure thin layers of platinum oxide, homogeneous, stable and strongly bonded to their substrate, and substrates coated with such thin layers can lead to the preparation of numerous products with interesting properties by simple heating, whether or not localised, of these layers, at a temperature above 250° C.

As is self-evident, and as results moreover already from the foregoing, the invention is in no way limited to those of its types of application and embodiments which have been more especially envisaged; it encompasses, on the contrary all modifications, particularly:

those where the axial magnetic field created in the cylindrical magnetron would be formed not from external annular electrical windings, but from permanent magnets arranged particularly within the cathode, then tubular, those where the magnetron used would be not a cylindrical type of revolution, like that described above, but of "planar" type, in which case the cathode is in the form of a plate, the magnetic field being created in this plate, parallel to one of the two large dimensions of the latter, and the anodic grid being plane and parallel to said plate.

We claim:

1. Device for preparing a substrate coated with a thin layer of pure platinum oxide said device comprising a magnetron including itself on the on hand means to generate a magnetic field and on the other hand, within an enclosure containing rarefied oxygen, a cathode extending parallel to the magnetic field, said cathode covered with at least a layer of platinum, and a grid forming an anode extending parallel to the cathode, facing its platinum layer, so as to preserve within the enclosure a chamber situated on the side, of the grid, opposite that where the cathode is situated, and said substrate being placed in said chamber so that its surface to be coated by the thin layer of platinum oxide is situated shielded from the impact of electrons which, coming from the cathode, are brought to circulate in this chamber after having traversed the grid.

2. Device according to claim 1, wherein the magnetron is cylindrical, i.e. the magnetic field extends along an axis, the cathode extends along this axis, the anode grid is cylindrical and surrounds the cathode, coaxially to the latter, and the chamber in which the substrate is placed is annular and outside the grid.

3. Device according to claim 1, wherein the shielding of the surface of the substrate to be coated is ensured by exposing this surface downstream from the trajectories of the electrons concerned.

4. Device according to claim 2, wherein the shielding of the surface of the substrate to be coated is ensured by placing in the chamber obstacles opaque to the electrons concerned.

5. Device according to claim 4, wherein the obstacles are flat bars of which the middle plane is perpendicular or almost perpendicular to the trajectories of the electrons concerned.

6. Device according to claim 1, wherein the shielding of the surface of the substrate to be coated is ensured by constituting the grid by means of flat bars of which the middle plane is perpendicular or almost perpendicular to the trajectories of the electrons concerned.

* * * * *